(12) United States Patent
Markunas et al.

(10) Patent No.: US 8,163,644 B2
(45) Date of Patent: Apr. 24, 2012

(54) TEMPLATE PROCESS FOR SMALL PITCH FLIP-CHIP INTERCONNECT HYBRIDIZATION

(75) Inventors: Justin K. Markunas, Washington, DC (US); Eric F. Schulte, Santa Barbara, CA (US)

(73) Assignee: United States of America as represented by the Secretary of the Army, Washington, DC (US)

( * ) Notice: Subject to any disclaimer, the term of this patent is extended or adjusted under 35 U.S.C. 154(b) by 378 days.

(21) Appl. No.: 12/571,812

(22) Filed: Oct. 1, 2009

(65) Prior Publication Data

US 2011/0079894 A1    Apr. 7, 2011

(51) Int. Cl.
*H01L 21/44*    (2006.01)
(52) U.S. Cl. ....................... 438/613; 438/618
(58) Field of Classification Search ............ 438/613
See application file for complete search history.

(56) References Cited

U.S. PATENT DOCUMENTS

| | | | | |
|---|---|---|---|---|
| 4,930,001 | A * | 5/1990 | Williams | 257/737 |
| 5,092,036 | A * | 3/1992 | Hu et al. | 29/854 |
| 5,539,153 | A | 7/1996 | Schwiebert et al. | |
| 6,099,935 | A | 8/2000 | Brearley et al. | |
| 6,372,622 | B1 | 4/2002 | Tan et al. | |
| 6,518,096 | B2 | 2/2003 | Chan et al. | |
| 6,550,665 | B1 * | 4/2003 | Parrish et al. | 228/180.22 |
| 6,740,577 | B2 | 5/2004 | Jin et al. | |
| 2008/0272499 | A1 | 11/2008 | DeNatale et al. | |

OTHER PUBLICATIONS

C4NP Technology for lead-free wafer bumping, IBM Research & IBM Systems and Technology Group, http://researchweb.watson.ibm.com/c4np/images/C4NPTechnicalPresentation.ppt , Sep. 2004.
IBM and SUSS Announces c4np Semiconductor Technology Agreement, IBM Research web page: http://researchweb.watson.ibm.com/c4np/ , print date Sep. 3, 2009.
Alan Huffman, RTI presentation on 50 Micron Pitch Flip Chip Bumping Technology, Center for Materials and Electronic Technologies (www.cpmt.org/scv), Sep. 13, 2006.
A schedule of conference on Next Generation Flip Chips on Sep. 18, 2008 at Microsystems Packaging Research Center (http://www.ece.gatech.edu/research/PRC/events/ngfc/index.htm).
Richard Labennett et al., Novel Advanced Interconnects, 2004 (http://ap.pennetnet.com/display_article/213884/36/ARTCL/none/none/1/Novel-Advanced-I).
Nextreme Expands Manufacturing Capacity to Meet Flip Chip Demand, a Nextreme announcement sheet on its flip chip program of Oct. 23, 2007.

* cited by examiner

*Primary Examiner* — Thien F Tran
(74) *Attorney, Agent, or Firm* — Richard J. Kim

(57) ABSTRACT

A process is disclosed for high density indium bumping of microchips by using an innovative template wafer upon which the bumps are initially fabricated. Once fabricated, these bumps are transferred to the microchip, after which can be hybridized to another microchip. Such a template wafer is reusable, and thus provides an economical way to fabricate indium bumps. Reusability also eliminates nonuniformities in bump shape and size in serial processing of separate microchips, which is not the case for other indium bump fabrication processes. Such a fabrication process provides a way to form relatively tall indium bumps and accomplishes this without the standard thick photoresist liftoff process. The described process can be suitable for bump pitches under 10 microns, and is only limited by the resolution of the photolithography equipment used.

8 Claims, 13 Drawing Sheets

TEMPLATE PROCESS FOR SMALL PITCH FLIP-CHIP INTERCONNECT HYBRIDIZATION

GOVERNMENT INTEREST

The invention described herein may be manufactured, used, sold, imported and/or licensed by or for the United States Government.

FIELD OF THE DISCLOSURE

The disclosure relates to a process for fabricating high density indium bumps based on a template wafer, and transfer of these bumps to hybridize microchips.

BACKGROUND INFORMATION

Devices that contain microelectronic components generally require a transfer of information from the chip to one or several other components on the system. In many cases, these other components are not monolithically fabricated on the same chip, where they could be easily interconnected through a variety of techniques. Instead, a highly conductive layer sandwiched between two components is required to transfer information. One of the industry standard ways to do this it by flip-chip bump bonding. This technique requires the deposition of a soft conductive material to be deposited on either one or both of the microchips to be bonded. Once performed, the two components are optically aligned in a piece of equipment called a hybrid bump bonder, or hybridizer. After this alignment process, the two chips are pressed together by the hybridizer. This pressure, sometimes with the addition of heat, causes a permanent bond of the two components due to adhesion of the soft conductive layer.

Like most things in the microelectronics industry, the pitch of these flip-chip interconnects has gotten smaller over time. This small pitch makes it increasingly difficult to hybridize two chips with a high yield of successful bonds. In some cases, new technology has emerged that allows for small pitch interconnection through vastly different techniques. However, for a variety of reasons, these techniques are generally not suitable when bonding together chips that are composed of different substrate materials. One example of this is in the infrared sensing industry, where the light sensing focal planar array composed of HgCdTe grown on CdZnTe is hybridized to a read-out integrated circuit composed of Si. These devices are generally thermally cycled between room temperature when they turned off to 77° K during operation. A large difference in the thermal coefficient of expansion between CdZnTe and Si causes the two microchips to expand and contract differently over this temperature range. This places a requirement on the interconnects to be soft and relatively tall in order to conform to the stress caused by thermal cycling. Due to these requirements, indium is the preferred interconnect material. As higher resolution focal planar arrays with smaller pixels are produced, smaller pitch In interconnects will be required to transfer information to the read-out integrated circuit. As this pitch falls below 10 µm, current technology will become less capable of successfully hybridizing the two microchips.

SUMMARY

A process is disclosed for high density indium bumping of microchips by using an innovative template wafer upon which the bumps are initially fabricated. Once fabricated, these bumps are transferred to the microchip, after which can be hybridized to another microchip. This template wafer is reusable, and thus provides an economical way to fabricate indium bumps. Reusability also eliminates nonuniformities in bump shape and size in serial processing of separate microchips, which is not the case for other indium bump fabrication processes.

In one aspect, a template wafer is disclosed for small pitch flip-chip interconnect hybridization, comprising: a core Si wafer; a Ni layer on a front side of said Si wafer; an Al layer on said Ni layer on the front side; a Ni layer on a backside of said Si wafer; an Al layer on said Ni layer on the backside; a nonconductive layer based on polytetrafluoroethylene up to a thickness of 20 microns as a top surface of said Al layer of said front side; and a nonconductive layer based on polytetrafluoroethylene on a back surface of said Al layer of said backside. Surface features are formed into said nonconductive layer of said front side. Said surface features are either etched or recessed down to expose said Ni layer on said front side to yield conductive features capable of indium plating to form indium bumps upon electroplating.

In another aspect, a template wafer fabrication process is disclosed, comprising: at least one of degreasing and removing an oxide surface of a core Si wafer; depositing a Ni layer on a front side of said Si wafer based on evaporation or sputtering; depositing an Al layer onto said Ni layer on the front side based on evaporation or sputtering; depositing a Ni layer on a backside of said Si wafer based on evaporation or sputtering; depositing an Al layer onto said Ni layer on the backside based on evaporation or sputtering; depositing a nonconductive layer based on polytetrafluoroethylene up to a thickness of 20 microns to a top surface of said Al layer of said front side; depositing a nonconductive layer based on polytetrafluoroethylene to a back surface of said Al layer of said backside; applying a baking procedure to remove solvents and/or smooth exposed surfaces upon depositing of at least one of said nonconductive layers; and forming surface features on said front side to expose at least said nonconductive layer underneath. Said surface features are either etched or imprinted down to expose said Ni layer on said front side, yielding conductive features capable of indium plating to form indium bumps upon electroplating. The evaporation can be either electron-beam or heated evaporation, and the sputtering can be either AC or DC sputtering.

The fabrication process described provides a way to form relatively tall indium bumps and accomplishes this without the standard thick photoresist liftoff process, which makes it nearly impossible to fabricate relatively tall bumps with a pitch under 10 microns. The described process is suitable for bump pitches under 10 microns and is only limited by the resolution of the photolithography equipment used. Additionally, this process is capable of producing relatively tall bumps with heights over 8 microns possible for 3 micron wide bumps at a 10 micron pitch. Such a large aspect ratio is important when hybridizing two microchips composed of different substrates that experience some thermal cycling. This is due to the need for the indium bumps to comply to strain caused by differences in the thermal coefficient of expansion of the two microchips.

BRIEF DESCRIPTION OF THE DRAWINGS

The detailed description is provided in reference to the attached drawings, wherein.

DETAILED DESCRIPTION

An exemplary indium bump transfer process is outlined in FIG. 1. An exemplary template wafer as fabricated is shown in FIG. 1a. Details of this process are discussed below. Such an exemplary template wafer is comprised of a conductive core layer 101 and nonconductive layers 102, 103 deposited and defined upon both sides of it. The top nonconductive layer 102 is based on polytetrafluoroethylene (PTFE) as indium does not stick well to it. The dimensions of this wafer can be at least as large as the dimensions of the area to be bumped on the microchip.

Figure 1A:
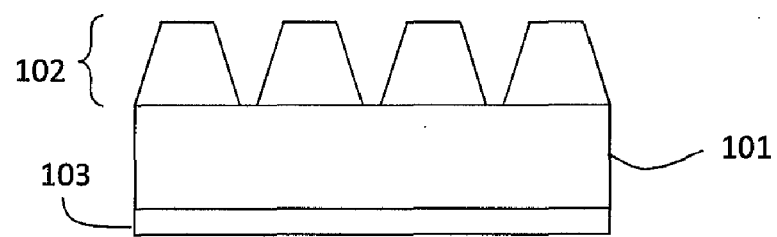
FIG. 1a shows an exemplary template wafer to illustrate a bump transfer process.
Figure 1B:
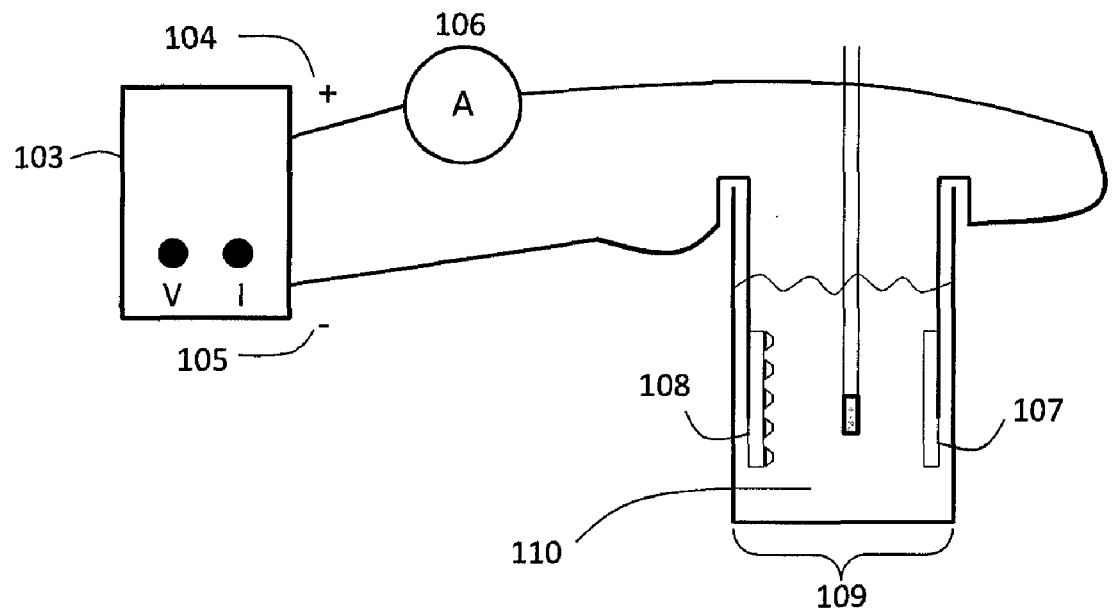
FIG. 1b shows such a template wafer in an exemplary electroplating setup.

After the fabrication step, the template wafer is placed in an electroplating setup FIG. 1b. The electroplating setup includes a power supply 103 that has the capability to run in a constant current mode. One such power supply is the Agilent 3616A. The positive terminal of the power supply 104 is electrically connected to one terminal of an ammeter 106 to monitor current being provided by the power supply. One may use the Fluke 8845A digital multimeter operating in ammeter mode. The other terminal of the ammeter is electrically connected to the anode 107. In an exemplary embodiment, the anode is composed of high-purity indium with a purity of 99.99% or better. One face of the anode has a surface area that is equal to or greater than that of the template wafer. The negative terminal of the power supply 105 is electrically connected to the template wafer 108. The template wafer is thus the cathode of the electroplating setup. Both the anode and cathode are placed in an acrylic tank 109. The two electrodes are placed parallel to one another, separated by 5 centimeters. The tank is filled with an indium electroplating solution 110 so that the electrodes can be fully immersed. One can use the Indium Sulfamate electroplating solution provided by Indium Corporation of America. A sparging tube 111 is also placed in the electroplating bath to improve mass transport by piping an inert gas, such as Ar or $N_2$.

Figure 1C:
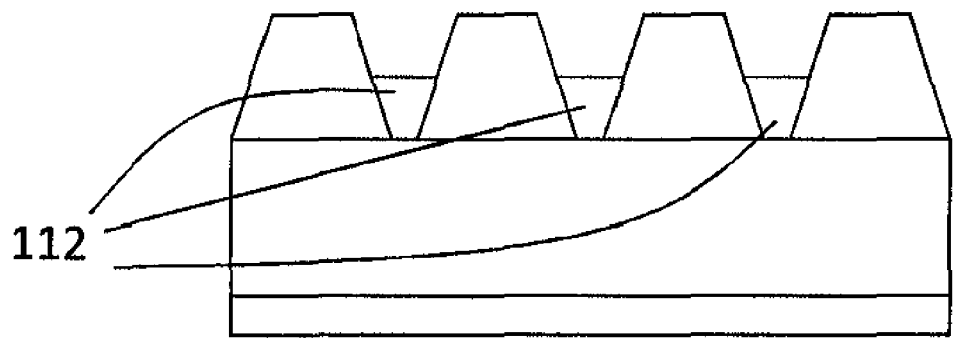
FIG. 1c shows an exemplary plating of a template wafer.
Figure 1D:
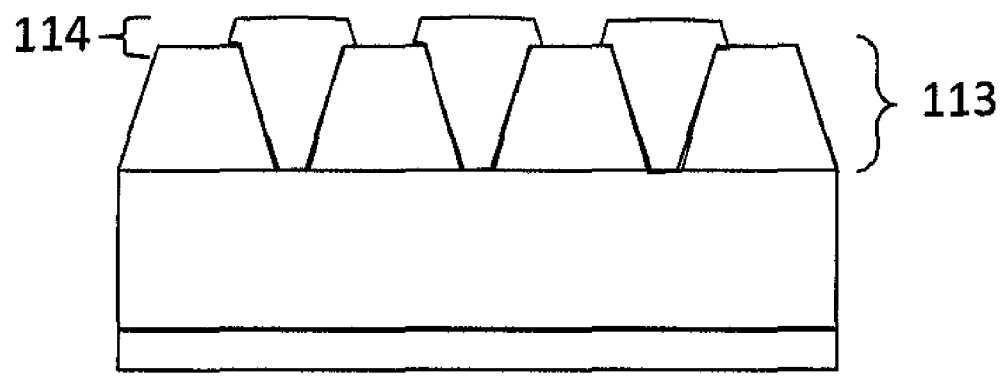
FIG. 1d shows a plated template wafer ready for transfer of indium.

Once the electroplating setup is connected, the power supply is turned on and current is raised to initiate indium plating. Initiation of plating 112 is shown in FIG. 1c, occurring only in regions where the conductive layer is exposed. The current is roughly in direct proportion to deposition rate, though current density should be kept between 108 and 216 $A/m^2$, where the area is the surface area of indium plating regions. FIG. 1d shows completion of plating when the indium overgrows the nonconductive layer 113. This overgrowth 114 should be on the order of 1 to 2 microns.

Figure 1E:
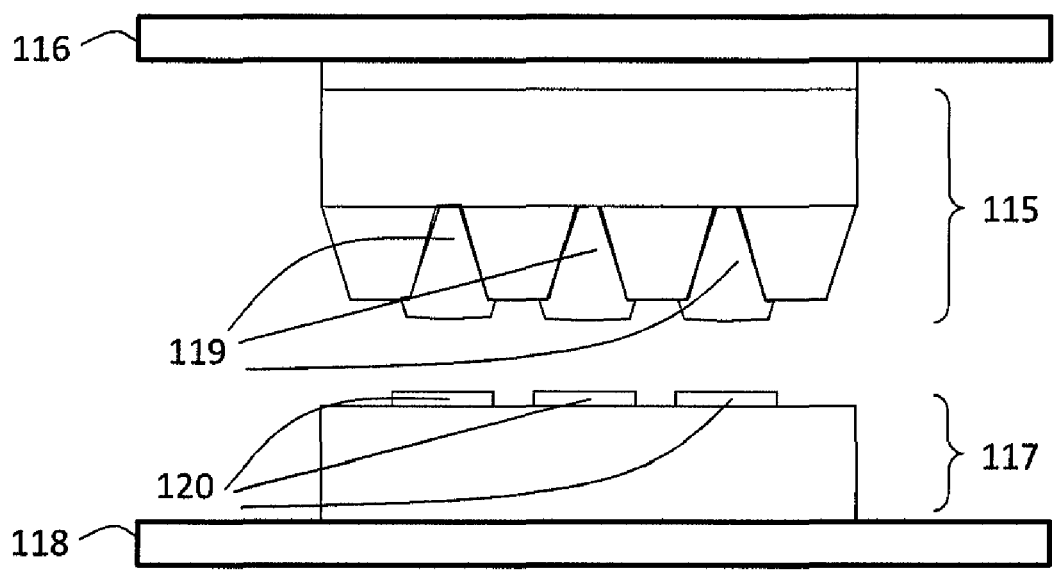
FIG. 1e shows an exemplary transfer process with a plated template wafer placed on a vacuum chuck.
Figure 1F:
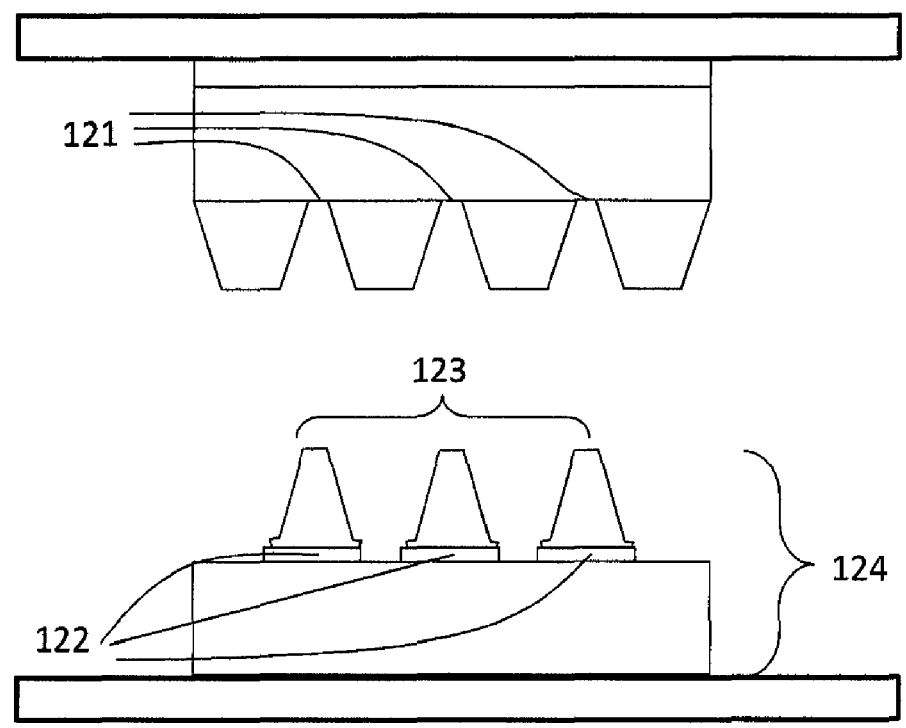
FIG. 1f shows a release of exemplary bumps from a template wafer.

The plated template wafer, shown in FIG. 1d is now ready for removal of exposed indium oxide and transfer of indium to a microchip. FIG. 1e shows the beginning of this process. The plated template wafer 115 is placed on the vacuum chuck 116 of a hybrid bump-bonder capable of micron resolution alignment. One such piece of equipment is the Suss Microtec FC-150. The microchip 117 after removal of oxide from the metallization pads is placed on the other vacuum chuck 118. The two wafers are aligned by the system so the indium 119 lines up with the metallization pads 120 of the microchip. Once aligned, the hybrid bump bonder presses the two, with or without heat, resulting in a bond between the indium and metallization pads. Upon releasing the two, the indium sticks to the metallization pads and releases from the template wafer, as shown in FIG. 1f. The release is possible due to the small surface area of indium at the conductive layer interface of the template wafer 121 compared to that of the metallization pad interface of the microchip 122. This is also possible due to the low adhesion of indium to PTFE that allows it to easily transfer. The result is a set of indium bumps 123 on the microchip 124.

Figure 1G:
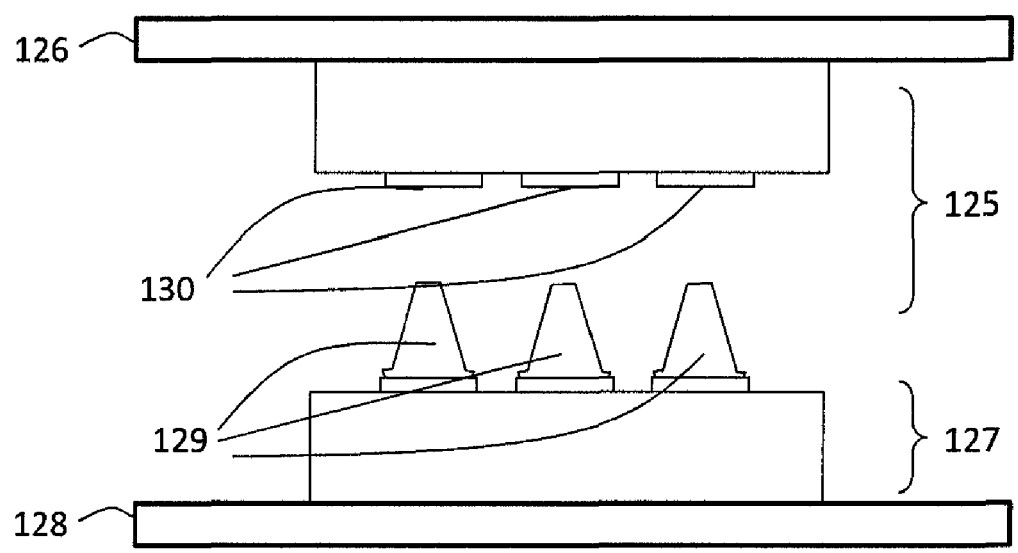
FIG. 1g shows a bumped microchip held on a vacuum chuck.
Figure 1H:
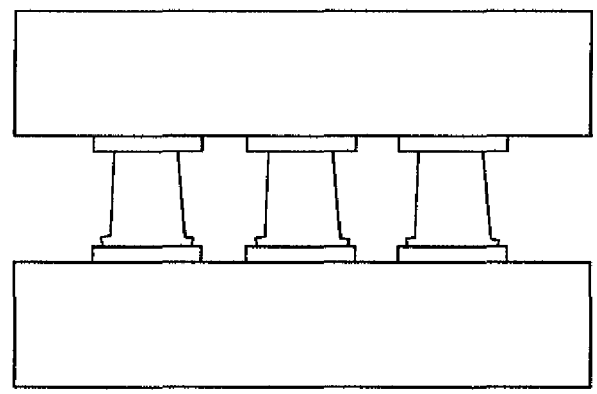
FIG. 1h shows exemplary hybridized microchips.

FIG. 1g shows the bumped microchip 125 held on the vacuum chuck of a hybrid bump bonder 126 after oxide removal from a remaining exposed indium, as in the above paragraph. Another microchip 127 which has the oxide likewise removed from its metallization pads is placed on the other vacuum chuck 128. The two wafers are aligned by the system so the indium 199 lines up with the metallization pads 130 of the second microchip. Once aligned, the hybrid bump bonder presses the two, with or without heat, resulting in a bond between the indium and metallization pads. FIG. 1h shows the hybridized microchips after the release of vacuum from the hybrid bump bonder.

Figure 2A:
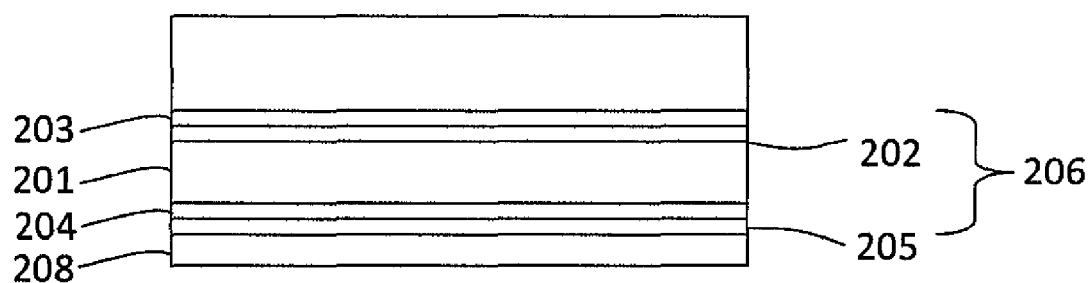
FIG. 2a shows exemplary layers in fabricating a template wafer.

Template Fabrication:

The initial layers of an exemplary fabrication of the template wafer are shown in FIG. 2a. In such an exemplary embodiment, a Si wafer 201 is the core of the template wafer. The Si wafer can be degreased by dipping in, e.g., acetone, methanol, isopropyl alcohol, and deionized water for two minutes. The oxide surface of the Si wafer can then be removed by dipping in a 2% HF in deionized water solution for 1 minute. A 1 micron Ni layer 202 is deposited on the front side of this wafer. One can perform deposition by a variety of techniques including (electron beam or heated) evaporation or (AC or DC) sputtering. This Ni layer will serve as the plating base where indium growth is initiated during the electroplating process described above. A 200 nanometer Al layer 203 is then deposited on the Ni layer by similar deposition techniques. Al is chosen because it sticks well to PTFE and will act as an adhesion layer. After deposition of these layers, a 1 micron Ni 204 layer followed by a 200 nanometer Al layer 205 are deposited on the backside of the Si wafer by the same deposition techniques. The purpose of these layers is to balance stress on the Si wafer to keep it as flat as possible. The sum of these layers 201-205 comprises the conductive layer of the transfer wafer 206.

In an exemplary embodiment, the top side nonconductive layer 209 is based on PTFE (polytetrafluoroethylene) Teflon™ AF 1601S with 18% solids provided by DuPont de Nemours & Co. This layer is spun onto the conductive layer at spin speeds in the 3000-5000 rpm range. By diluting the Teflon™ 1691S in Fluorinert™ FC-770 provided by 3M, the thickness of the nonconductive layer can be spun-on as thick as 20 microns. The thickness of this layer is chosen to be roughly 1 to 2 microns less than the desired final height of the indium bumps. After spin-on of the nonconductive layer, a baking procedure is necessary to drive out solvents and allow for smoothing out of the surface. This procedure is as follows. The wafer is placed on a hotplate held at 112° C. for 15 minutes. The temperature is then ramped to 165° C. for 15 minutes. At this point, all of the solvents are driven out of the nonconductive layer. Finally, the wafer is held for 30 minutes at 335° C. on the hotplate to smoothen out the layer. Afterwards, the wafer is allowed to cool. A backside nonconductive layer 208 is spun onto the backside of the wafer by the same procedure as for the top side layer. The baking process is also the same, except the 335° C. step is omitted as surface morphology of the backside is not critical. The purpose of this layer is to stop any deposition of indium onto the backside of the wafer during electroplating.

Figure 2B:
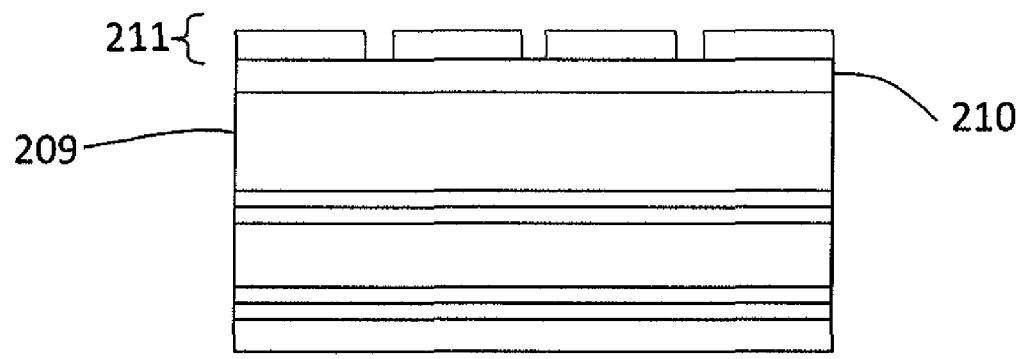
FIG. 2b shows deposition, patterning and etching of an exemplary mask for the top of a nonconductive layer.

FIG. 2b shows the deposition, patterning and etching of an Al etch mask necessary to define the top side nonconductive layer 209. This process begins with the deposition of 200 nanometers of Al 210. This layer can be deposited by a variety of standard techniques including (electron beam or heated) evaporation or (AC or DC) sputtering. The Al layer acts as the etch mask for the nonconductive layer because Teflon™ AF 1601S has a high etch selectivity over it during plasma etching. Al is also chosen because it adheres well to Teflon™ AF 1601S. After the Al deposition, a standard photolithography step is performed to define features in the photoresist layer 211. These features will eventually be defined down to the conductive layer by etching, so their dimensions are those upon which indium plating will initiate to form indium bumps during the electroplating step.

Figure 2C:
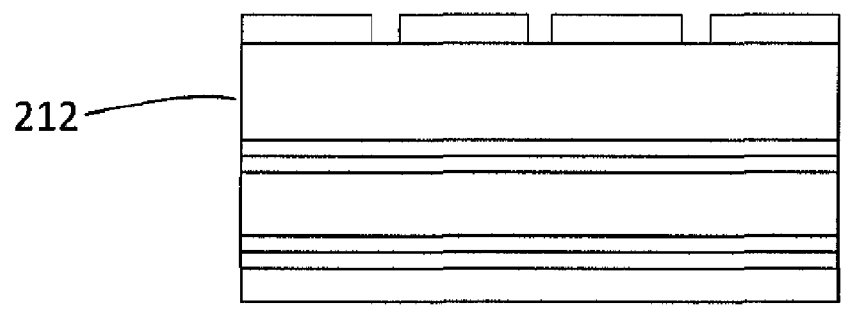
FIG. 2c shows an exemplary template wafer after etching.
Figure 2D:
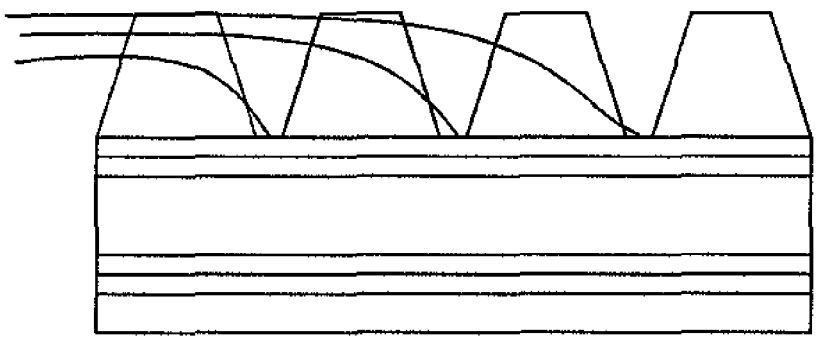
FIG. 2d shows an exposed under layer in an exemplary fabrication process.

To produce, e.g., 10 micron pitch bumps, these features can have a 10 micron pitch and their individual size can be on the order of 2-4 microns. This photolithography step can be the limiting factor of the minimum bump size and pitch attainable for such an exemplary template fabrication procedure. Therefore, higher resolution photolithography techniques should allow for bump sizes under 1 micron and pitches on the order of a couple of microns. The Al layer is then etched, where exposed regions are etched, exposing the nonconductive layer underneath. The etching can be performed either by chemical etching or plasma etching. One chemical etch that can be used is the PAN etch. This etch is comprised of phosphoric acid, acetic acid, nitric acid, and de-ionized water in a 16:1:1:2 ratio held at 40° C. FIG. 2c shows the template wafer after etching of the Al etch mask layer and removal of the photoresist by acetone bath of photoresist stripper.

After definition of the etch mask, the nonconductive layer 212 is defined by a plasma etching step. Etching of PTFE, including Teflon™ AF 1601S is achieved by a reactive ion etching process using a mixture of Ar and O₂ gases at several hundred eV. Obtaining proper sidewall angle is critical for good transfer of indium from the template wafer to the microchip, as already discussed. The gas mixture should thus be tuned to obtain sidewall angles of roughly 70 degrees with respect to interface of the layers of the wafer.

Figure 2E:
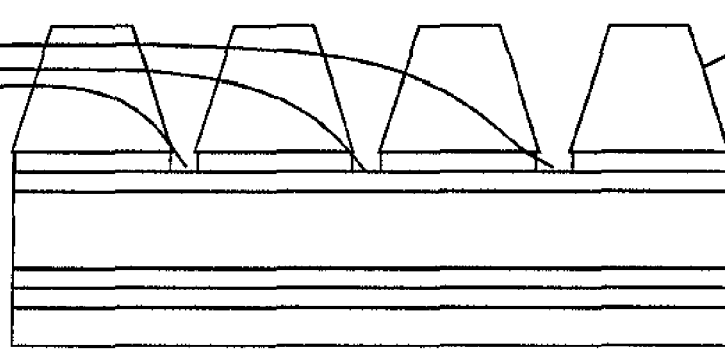
FIG. 2e shows an exemplary finished template wafer.

Fabrication of the template wafer is completed by etching away the exposed Al under layer 213 by a chemical etch or plasma etch. Once again, the PAN etch described above could be used to for this purpose. FIG. 2e shows the finished template wafer, where exposed Ni 214 will serve as the plating base upon which indium growth will begin during electroplating.

Second Exemplary Embodiment

Alternate Teflon™ Deposition Techniques

Another exemplary embodiment follows FIGS. 2a-e. The following steps occur in the same manner as the initial exemplary embodiment: degreasing and oxide etching dip of the Si wafer, about 500 nanometer to 1 micron topside Ni deposition and 200 nanometer Al deposition, and backside about 500 nanometer to 1 micron Ni deposition and 200 nanometer Al deposition. This exemplary embodiment uses a different set of techniques to deposit the topside nonconductive layer 207 and backside nonconductive layer 208 of FIG. 2b. Instead of using spin-on Teflon™ AF 1601-S to deposit these layers, PTFE can be deposited in a vacuum chamber onto the conductive layer of the transfer wafer 206 shown in FIG. 2a. One can use either RF sputtering deposition or atomic layer deposition (ALD) to perform deposition of PTFE. The thickness of the deposition of the topside nonconductive layer can be chosen to be roughly 1 to 2 microns less than the desired final height of the indium bumps. The thickness of the deposition of the backside nonconductive layer can be chosen to be about 1 micron. This thickness is not critical and only serves to cover the backside of the wafer to stop any deposition of indium onto the backside of the wafer during electroplating. No baking steps are required after deposition.

After deposition of the PTFE nonconductive layers, fabrication proceeds as in the initial exemplary embodiment. This includes: deposition, patterning and etching of the 200 nanometer thick Al etch mask, plasma etching of the topside nonconductive layer, removal of the 200 nanometer thick Al etch mask, and etching of the exposed 200 nanometer thick Al under layer.

Third Exemplary Embodiment

Etching Notches

Yet another exemplary embodiment follows FIG. 2a. The following steps occur in the same manner as the initial exemplary embodiment: degreasing and oxide etching dip of the Si wafer, about 500 nanometer to 1 micron topside Ni deposition and 200 nanometer Al deposition, backside about 500 nanometer to 1 micron Ni deposition and 200 nanometer Al deposition, deposition of the topside nonconductive layer by either of the techniques described in the previous exemplary embodiments, and deposition of the backside nonconductive layer by either of the techniques described in the previous exemplary embodiments.

Figure 3A:
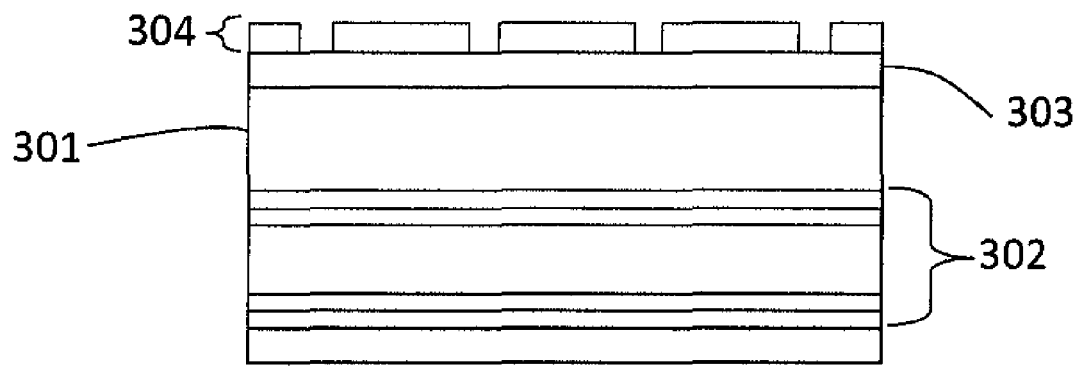
FIG. 3a shows a fabrication of another exemplary template-wafer embodiment.
Figure 3B:
FIG. 3b shows fabrication of said another exemplary template-wafer embodiment after etching.

FIG. 3a shows how fabrication proceeds for this exemplary embodiment. Just as in the initial exemplary embodiment, a 200 nanometer Al etch mask 303 is deposited on the nonconductive layer 301 by the same techniques. After the Al deposition, a standard photolithography step is performed to define features in the photoresist layer 304. These features, unlike the previous exemplary embodiments, will not be used to etch down to the nonconductive layer 302. Instead, these features will be used to define features that are etched partially down the nonconductive layer, which will be referred to as isolation notches. The purpose of these features is to delay touching of indium of adjacent plating regions of the template wafer. As previously set forth, indium overgrowth above the nonconductive layer facilitates the indium transfer process. As overgrowth occurs, lateral growth of indium occurs as well. These isolation notches will essentially isolate adjacent growth areas from one another by providing a longer path for lateral growth before touching occurs. The dimension of these features will depend on the pitch and size of bumps required. For 10 micron pitch bumps with an individual size of 3 microns, e.g., 2 micron notches can be used. As discussed in the initial exemplary embodiment, the size of these features is limited by the photolithography process involved. The Al layer is then etched, where exposed regions are etched, exposing the nonconductive layer underneath. The etching can be performed either by chemical etching or plasma etching as discussed in the initial exemplary embodiment. FIG. 3b shows the template wafer after etching of the Al etch mask layer and removal of the photoresist with acetone or photoresist stripper.

Figure 3C:
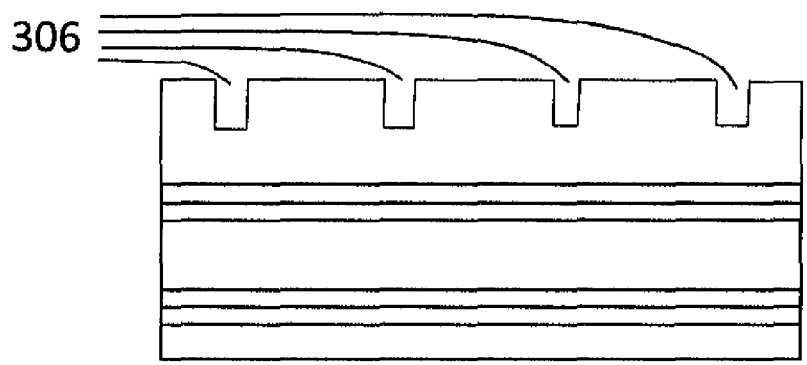
FIG. 3c shows fabrication of said another exemplary template-wafer embodiment with defined isolation notches.

After definition of the etch mask, the nonconductive layer 305 is defined by a plasma etching step using the same techniques as the described in the initial exemplary embodiment. The etching proceeds until roughly half of the thickness of the exposed nonconductive layer is exposed to form the isolation notches. FIG. 3c shows the template wafer after the nonconductive layer etching process to define isolation notches 306 and removal of the Al layer by a chemical etch previously described.

Figure 3D:
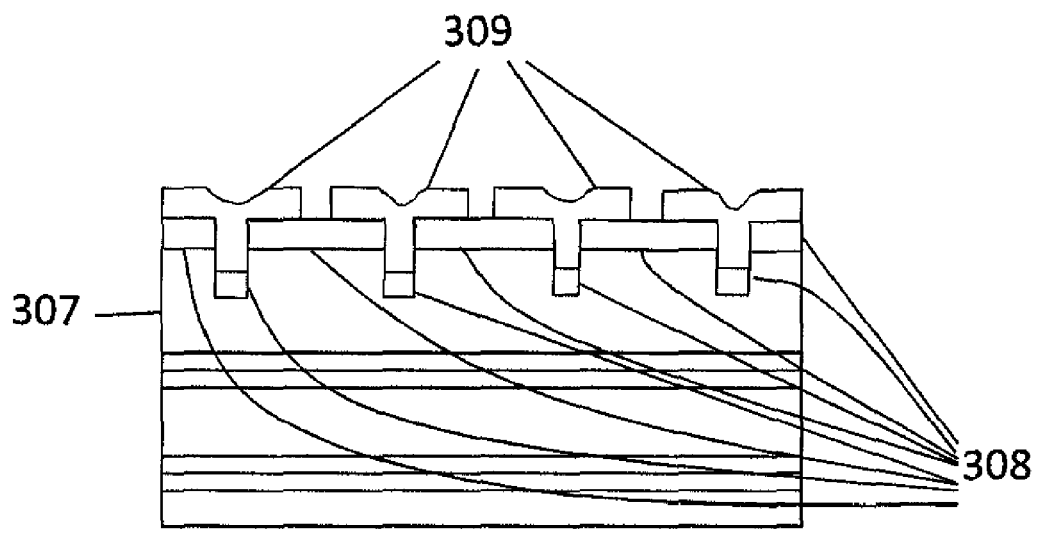
FIG. 3d shows deposition, patterning and etching of an exemplary mask for the top of a nonconductive layer of said another exemplary template-wafer embodiment.
Figure 3E:
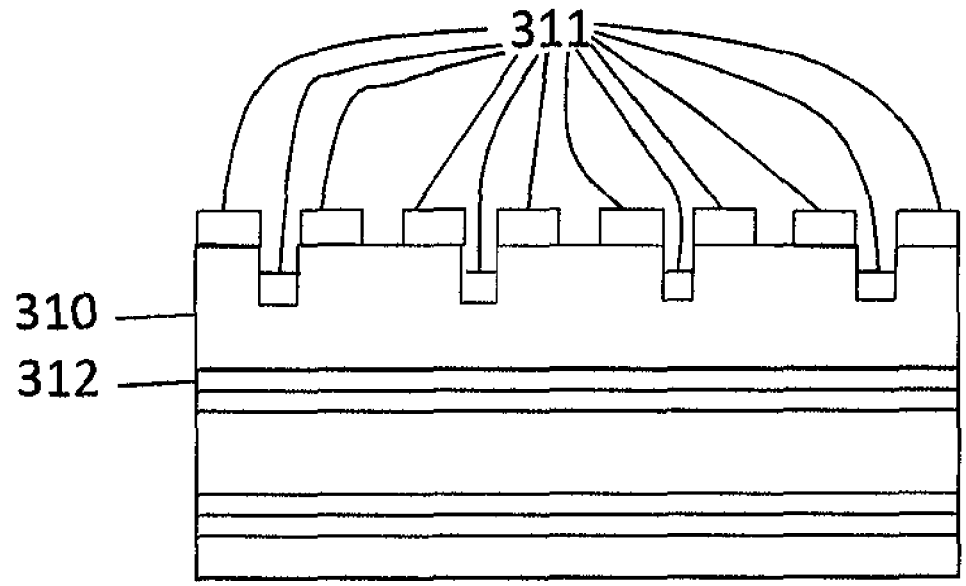
FIG. 3e shows said another exemplary template-wafer embodiment after the etching and removal of a photoresist.

FIG. 3d shows the deposition, patterning and etching of an Al etch mask necessary to define the top side nonconductive layer 307. This process follows the procedure of the initial exemplary embodiment, where a 200 nanometer Al layer 308 is deposited, followed by definition of features in a photoresist layer 309 by a standard photolithography process and etching away of the exposed Al layer. FIG. 3e shows the template wafer after etching of the Al etch mask layer and removal of the photoresist with acetone or photoresist stripper.

Figure 3F:
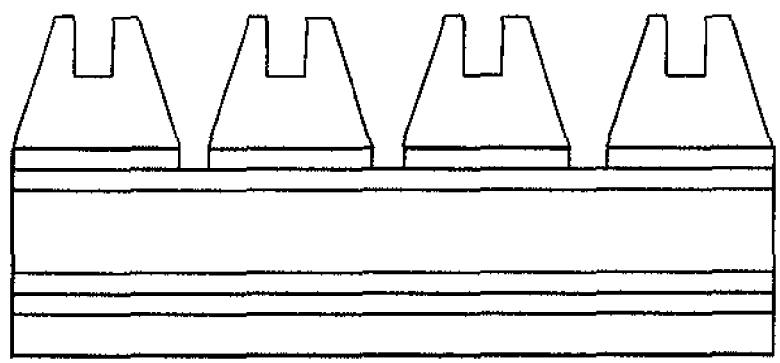
FIG. 3f shows the completion of said another exemplary template-wafer embodiment.

After etching of the Al etch mask, fabrication proceeds as in the initial embodiment. This includes: plasma etching of the topside nonconductive layer 310, removal of the 200 nanometer thick Al etch mask 311, and etching of the exposed 200 nanometer thick Al under layer 312. The completed template wafer is shown in FIG. 3f.

Fourth Exemplary Embodiment

Imprint Fabrication

Yet, another exemplary embodiment follows FIG. 2a. The following steps occur in the same manner as the initial embodiment: degreasing and oxide etching dip of the Si wafer, about 500 nanometer to 1 micron topside Ni deposition and 200 nanometer Al deposition, backside about 500 nanometer to 1 micron Ni deposition and 200 nanometer Al deposition, deposition of the topside nonconductive layer by either of the techniques described in the previous embodiments, and deposition of the backside nonconductive layer by either of the techniques described in the previous embodiments.

This exemplary embodiment differs from previous ones in the way that the features on the topside nonconductive layer are defined. Rather than using an etch mask followed by etching, this exemplary embodiment involves imprinting the topside nonconductive layer with features defined on another wafer, to be called the imprinting wafer. The result is that the features on the nonconductive layer will be a negative of the features defined on the imprinting wafer. The procedure for this process is described below.

Figure 4A:
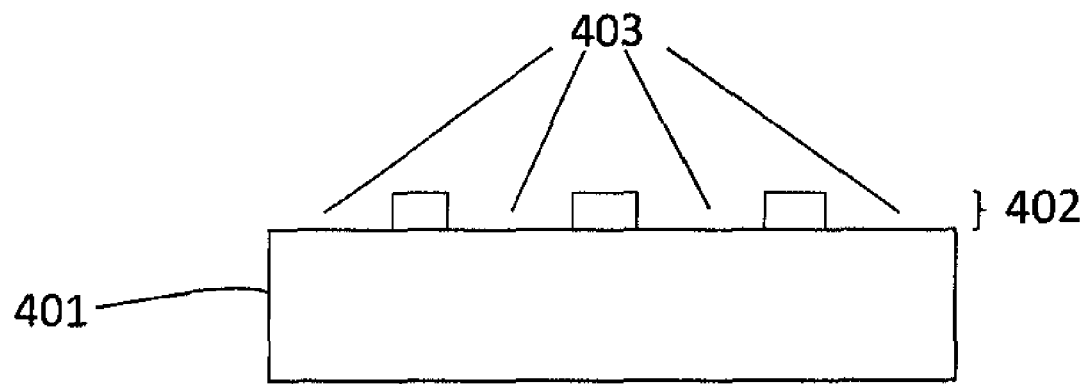
FIG. 4a shows the fabrication of an exemplary imprinting wafer.

As shown in FIG. 4a, fabrication of such an exemplary imprinting wafer begins with a Si wafer 401 of the same dimensions as the Si wafer used as the core of the template wafer. A standard photolithography step is performed to define features in the photoresist layer 402. In the end, these features 403 will be used to etch into the silicon wafer and then imprinted into the nonconductive layer to form the mesas 215 shown in FIG. 2e. The dimension of these features will depend on the pitch and size of bumps required. If a 10 micron bump pitch is desired with 3 micron bumps, these features will be roughly 7 microns because these features are the negative of the features imprinted in the nonconductive layer.

Figure 4B:
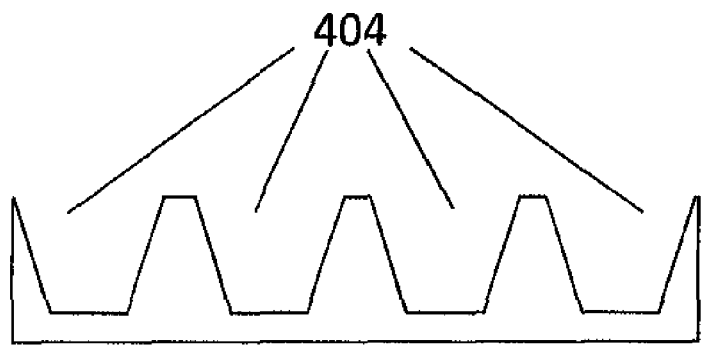
FIG. 4b shows an exemplary patterned imprinting wafer with etched trenches.

FIG. 4b shows such an exemplary patterned imprinting wafer after etching trenches 404 in it. These trenches can be formed by placing the wafer in a plasma etching system, such as a reactive ion etching (RIE) system or inductively coupled plasma (ICP) etching system where a mixture of $O_2$ and $SF_6$ etch away the exposed Si. Sidewall angle is controlled by the ratio of the two gasses and is controlled to etch sidewalls roughly 70 degrees with respect to the surface of the imprinting wafer. Etching proceeds until the etch depth is equal to the thickness of the nonconductive layer. After etching, the photoresist layer is removed with acetone or photoresist stripper.

Figure 4C:
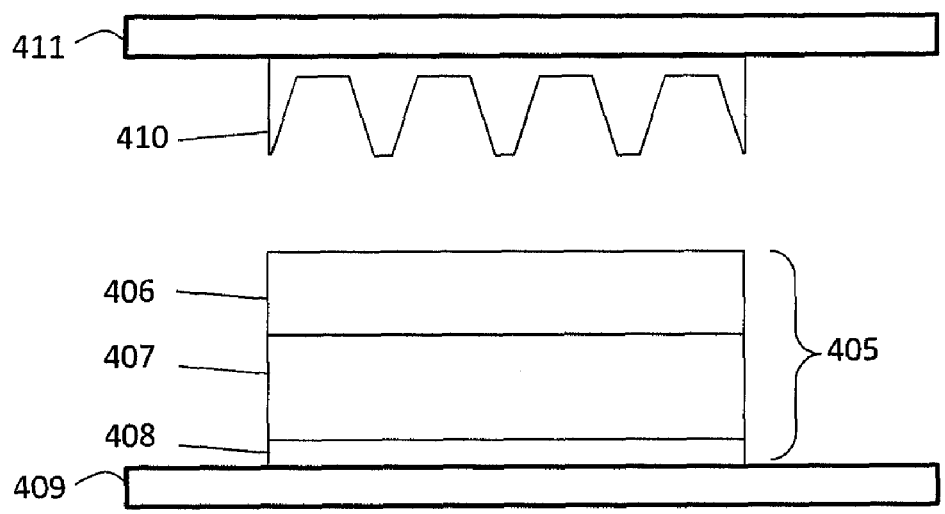
FIG. 4c shows an exemplary incomplete template wafer placed on a vacuum chuck for imprinting.
Figure 4D:
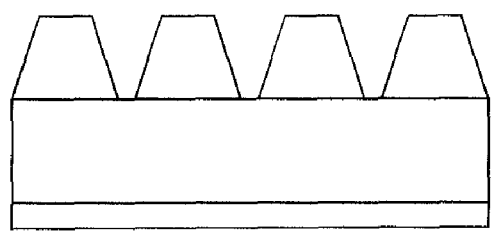
FIG. 4d shows an exemplary template wafer as imprinted

After completing the fabrication of the imprinting wafer, the imprinting step follows, shown in FIG. 4c. The incomplete template wafer 405, consisting of a conductive layer 406, an undefined topside nonconductive layer 407 and a nonconductive backside layer 408, is placed on the vacuum chuck 409 of a hybrid bump-bonder capable of micron resolution alignment. One such piece of equipment is the Suss Microtec FC-150. The imprinting wafer 410 is placed on the other vacuum chuck 411. The two wafers are roughly aligned and heated past the glass transition temperature of the nonconductive layer. If this layer was formed using the first embodiment using Teflon AF 1601S, this temperature is 160° C. If this layer was formed using the second embodiment, this temperature will depend on the specific PTFE used. After heating, the two wafers are pressed together, held for several minutes, allowed to cool back to room temperature, and finally separated from one another. The result is an exemplary completed template wafer, shown in FIG. 4d.

Using this process, it is possible to form the isolation notches fabricated in the third embodiment. This requires an extra photolithography and etching step in the imprinting wafer to form negatives of the notches.

The invention has been described in an illustrative manner. It is to be understood that the terminology which has been used is intended to be in the nature of words of description rather than limitation. Many modifications and variations of the invention are possible in light of the above teachings. Therefore, within the scope of the appended claims, the invention may be practiced other than as specifically described.

What we claim is:

1. A template process for high density indium bump transfer to microchips, comprising:

initially fabricating indium bumps on a template wafer and removing the oxidation from the exposed indium and from corresponding metallization pads of one of said microchips;

transferring said initially fabricated indium bumps to the metallization pads of one of said microchips and removing the oxidation from a remaining exposed surface of the transferred indium bumps and from corresponding metallization pads of another of said microchips; and hybridizing said microchip onto another microchip of said microchips based on bonding said transferred indium bumps onto aligned metallization pads of said another microchip.

2. The process according to claim 1, wherein said template wafer is reusable for fabricating indium bumps in serial processing of separate microchips, and wherein relatively tall indium bumps can be formed with a pitch under 10 microns without using a thick photoresist liftoff process.

3. The process according to claim 1, wherein photolithography equipment is used to achieve bumps with heights over 8 microns for 3 micron wide bumps at a 10 micron pitch.

4. The process according to claim 1, wherein said indium bumps have a sufficient aspect ratio to hybridize two microchips of different substrates subject to strain caused by differences in the thermal coefficient of expansion of the two microchips.

5. The process according to claim 1, wherein said template wafer is comprised of:
   a conductive core layer; and
   nonconductive layers deposited and defined upon both sides of said conductive core layer, wherein one nonconductive layer is based on polytetrafluoroethylene.

6. The process according to claim 1, wherein said template wafer is placed in an electroplating setup with an indium sulfamate bath to electroplate said template wafer and initially fabricate indium bumps on a template wafer.

7. The process according to claim 1, wherein said transfer of said initially fabricated indium bumps to metallization pads of one of said microchip is based on placing said template wafer having said initially fabricated indium bumps on a vacuum chuck of a hybrid bump-bonder capable of micron resolution alignment, and wherein said microchip is placed on an opposite vacuum chuck to be aligned, pressed with or without heating against said template wafer using said hybrid bump bonder.

8. The process according to claim 1, wherein said hybridizing said microchip onto another microchip of said microchips comprises:
   placing said another microchip on a vacuum chuck opposite a vacuum chuck of a hybrid bump bonder holding said microchip;
   aligning said indium bumps against said metallization pads of said another microchip;
   pressing with or without heating said microchip against said another microchip using said hybrid bump bonder to bond between the indium bumps and said metallization pads; and
   releasing vacuum from said hybrid bump bonder upon hybridizing said microchips.

\* \* \* \* \*